(12) United States Patent
Uchida

(10) Patent No.: US 6,188,641 B1
(45) Date of Patent: Feb. 13, 2001

(54) SYNCHRONOUS SEMICONDUCTOR MEMORY DEVICE HAVING INPUT CIRCUIT WITH REDUCED POWER CONSUMPTION

(75) Inventor: Toshiya Uchida, Kawasaki (JP)

(73) Assignee: Fujitsu Limited, Kanagawa (JP)

( * ) Notice: Under 35 U.S.C. 154(b), the term of this patent shall be extended for 0 days.

(21) Appl. No.: 09/537,387

(22) Filed: Mar. 29, 2000

(30) Foreign Application Priority Data

Mar. 31, 1999 (JP) .................................. 11-092246

(51) Int. Cl.$^7$ ...................................................... G11C 8/18
(52) U.S. Cl. .......................... 365/233; 365/193; 365/194; 365/195; 365/227; 365/222
(58) Field of Search .................................... 365/233, 191, 365/193, 194, 195, 222, 227, 226

(56) References Cited

U.S. PATENT DOCUMENTS 5,767,712 * 6/1998 Takemae et al. ..................... 327/152
6,009,039 * 12/1999 Takemae et al. ..................... 365/233

FOREIGN PATENT DOCUMENTS 7-230688    8/1995   (JP)  .............................. G11C/11/407

* cited by examiner

Primary Examiner—Andrew Q. Tran
(74) Attorney, Agent, or Firm—Arent Fox Kintner Plotkin & Kahn, PLLC (57) ABSTRACT

To reduce wasteful power consumption at an input circuit without increasing in number of exterior wiring, there are provided command input circuits 24 and 26 for latching a command CMD on the rise of an internal clock CLK1, a command decoder for decoding the latched command, a chip select signal input circuits 41, 40 and 20 for activating an enable signal EN1 in response to activation of a chip select signal *CS, deactivating the EN1 in response to deactivation of the *CS after the next pulse of an external clock CLK and generating an internal chip select signal *CSC by synchronizing the *CS with the CLK, a clock input circuit 21 for passing through the CLK while the EN1 is active, and a D-flip-flop for generating a command data activating signal by synchronizing the internal chip select signal *CSC with the CLK1.

14 Claims, 10 Drawing Sheets

SYNCHRONOUS SEMICONDUCTOR MEMORY DEVICE HAVING INPUT CIRCUIT WITH REDUCED POWER CONSUMPTION

BACKGROUND OF THE INVENTION

1. Field of the Invention

The present invention relates generally to synchronous semiconductor memory devices which input and output signals in synchronization with a clock, more particularly, to SDRAMs (synchronous random access memories) having input circuits with reduced power consumption.

2. Description of the Related Art

Since DRAM is of a high storage density but consumes a large amount of power compared with SRAM, reduction in power consumption has been demanded.

Figure 9:
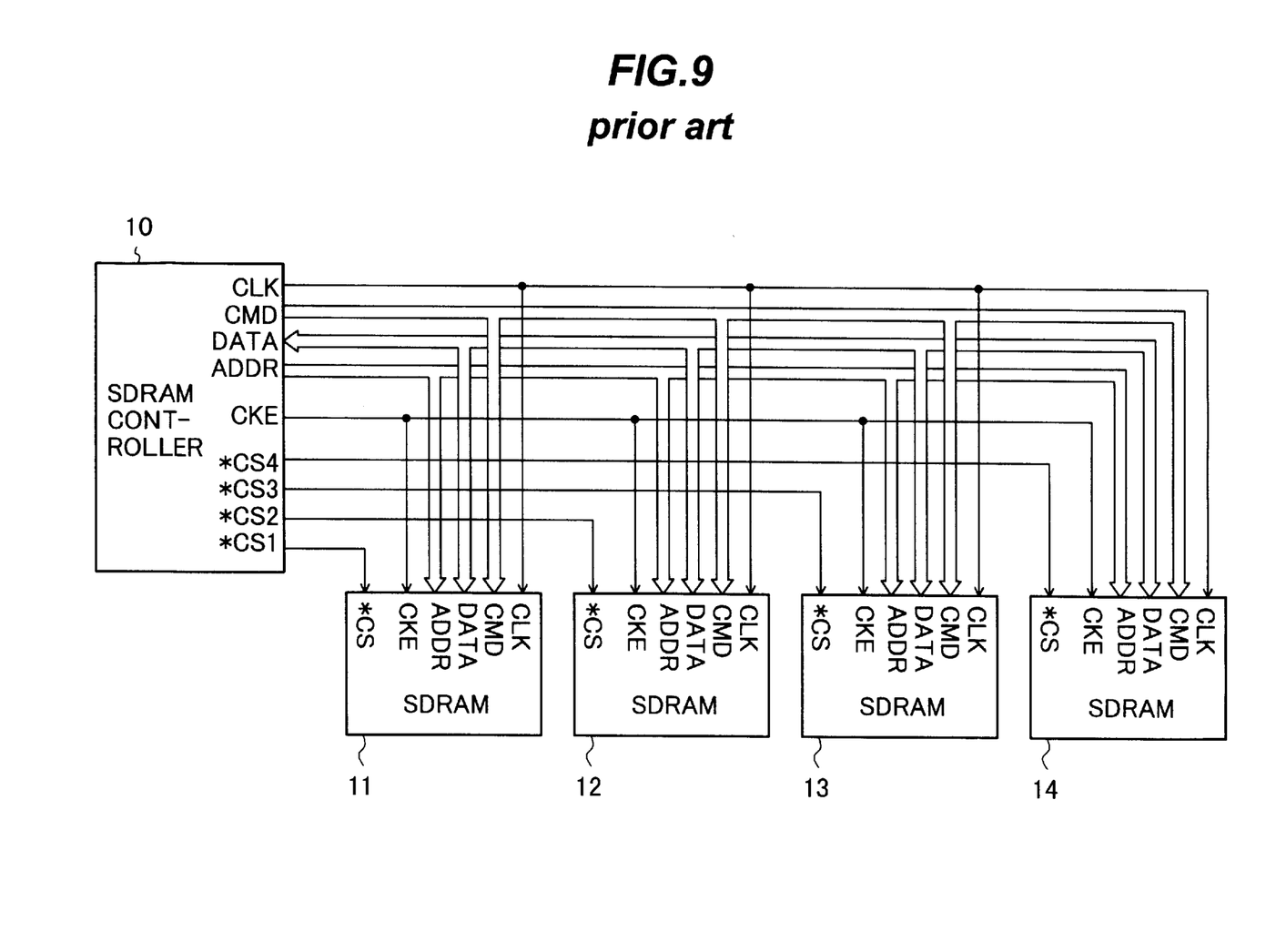
FIG. 9 is a prior art wiring diagram between a SDRAM controller and a plurality of SDRAMs.

FIG. 9 is a wiring diagram between a SDRAM controller 10 and a plurality of SDRAMs 11 to 14.

The SDRAM controller 10 decodes the higher order 2-bits of an address provided thereto to produce chip select signals *CS1 to *CS4, and further not only divides the address except the higher order 2 bits into row and column addresses (ADDR) to perform time-division multiplex, but also generates the row address strobe signal RAS and the column address strobe signal CAS in relation to the row and column addresses. The RAS and CAS signals constitute a multi-bit command CMD together with the write enable signal WE. The SDRAM controller 10 sets the clock enable signal CKE high, which is used for generating an internal clock through an AND operation with an external clock CLK, prior to selection of one of SDRAMs 11 to 14.

The SDRAMs 11 to 14 are connected to a microprocessor not shown through the SDRAM controller 10. The chip select signal outputs *CS1 to *CS4 of the SDRAM controller 10 are respectively connected to the chip select signal inputs *CS of the respective SDRAMs 11 to 14, and the outputs of the external clock CLK, command CMD, DATA, address ADDR and clock enable signal CKE of the SDRAM controller 10 are commonly connected to corresponding terminals of the SDRAMs 11 to 14.

When the signals *CS1 to *CS4 are all high and thereby all the SDRAMs 11 to 14 are not selected, the clock enable signal CKE is set low to stop the internal clock in each of the SDRAMs 11 to 14, whereby the input circuits that synchronizes an input with the internal clock becomes deactivate, resulting in reducing consumption of power in each of the SDRAMs 11 to 14.

Figure 10:
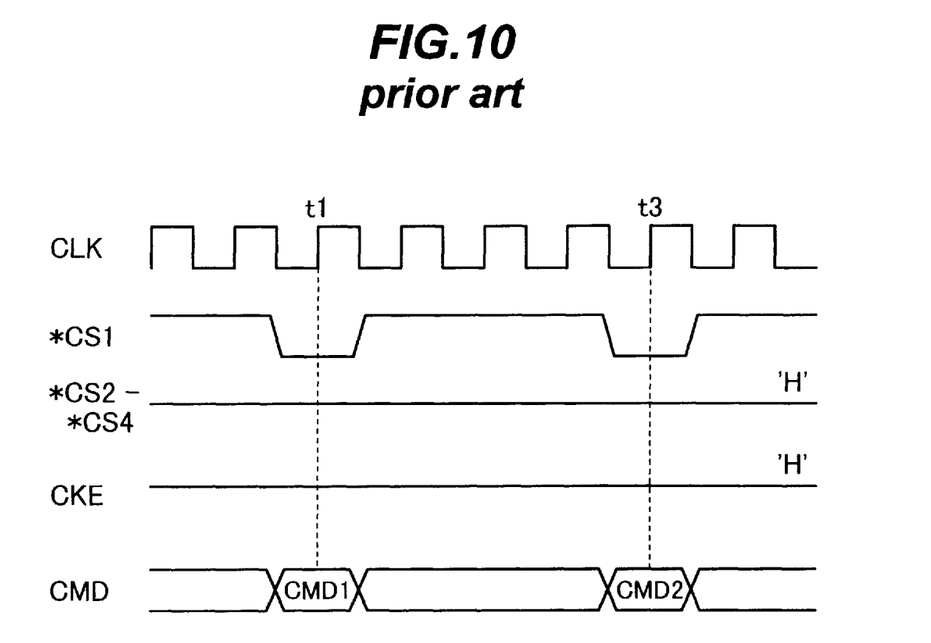
FIG. 10 is a schematic timing chart showing operation of the circuit of FIG. 9.

However, as shown in FIG. 10 for example, when only the SDRAM 11 of the SDRAMs 11 to 14 is selected by setting only the chip select signal *CS1 to low while the signals *CS2 to *CS4 are kept high, power is wasted in the non-selected SDRAMs 12 to 14 since the clock enable signal CKE is set high prior to the selection of the SDRAM 11 and thereby the internal clocks in the SDRAMs 12 to 14 operate and thus the input circuits thereof are activated.

In order to avoid this inconvenience, if independent clock enable signals are provided to the respective SDRAMs 11 to 14, the number of interconnections increases and a configuration of wiring becomes complicated.

SUMMARY OF THE INVENTION

Accordingly, it is an object of the present invention to provide a synchronous semiconductor memory device enabling reduction in useless power consumption of input circuits with no increase in the number of external interconnections.

In the present invention, there is provided a synchronous semiconductor memory device comprising: a command input circuit, for latching an external command in synchronization with an internal clock; and a command decoder, for decoding the latched external command; a chip select signal input circuit, receiving an external chip select signal, for activating an enable signal in response to activation of the external chip select signal, for deactivating the enable signal in response to deactivation of the external chip select signal, for generating an internal chip select signal by synchronizing the external chip select signal with the external clock; a clock input circuit, for outputting the internal clock depending on the external clock while the enable signal is active; and a decode enabling circuit, for generating a command decoder activating signal by synchronizing the internal chip select signal with the internal clock.

With the present invention, when the internal chip select signal is active, the command decoder activating signal is generated in synchronization with the internal clock and operation is performed depending on the decoded result of the command decoder, therefore it is not necessary to use the prior art clock enable signal. Further, when the external chip select signal is inactive, the enable signal is inactive, thereby the clock input circuit and the command input circuit of a non-select synchronous semiconductor memory device is inactive, resulting in decreasing in power consumption of the memory device.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below. A signal which is active low will be denoted with adding "*" to a reference character.

First Embodiment

Figure 1:
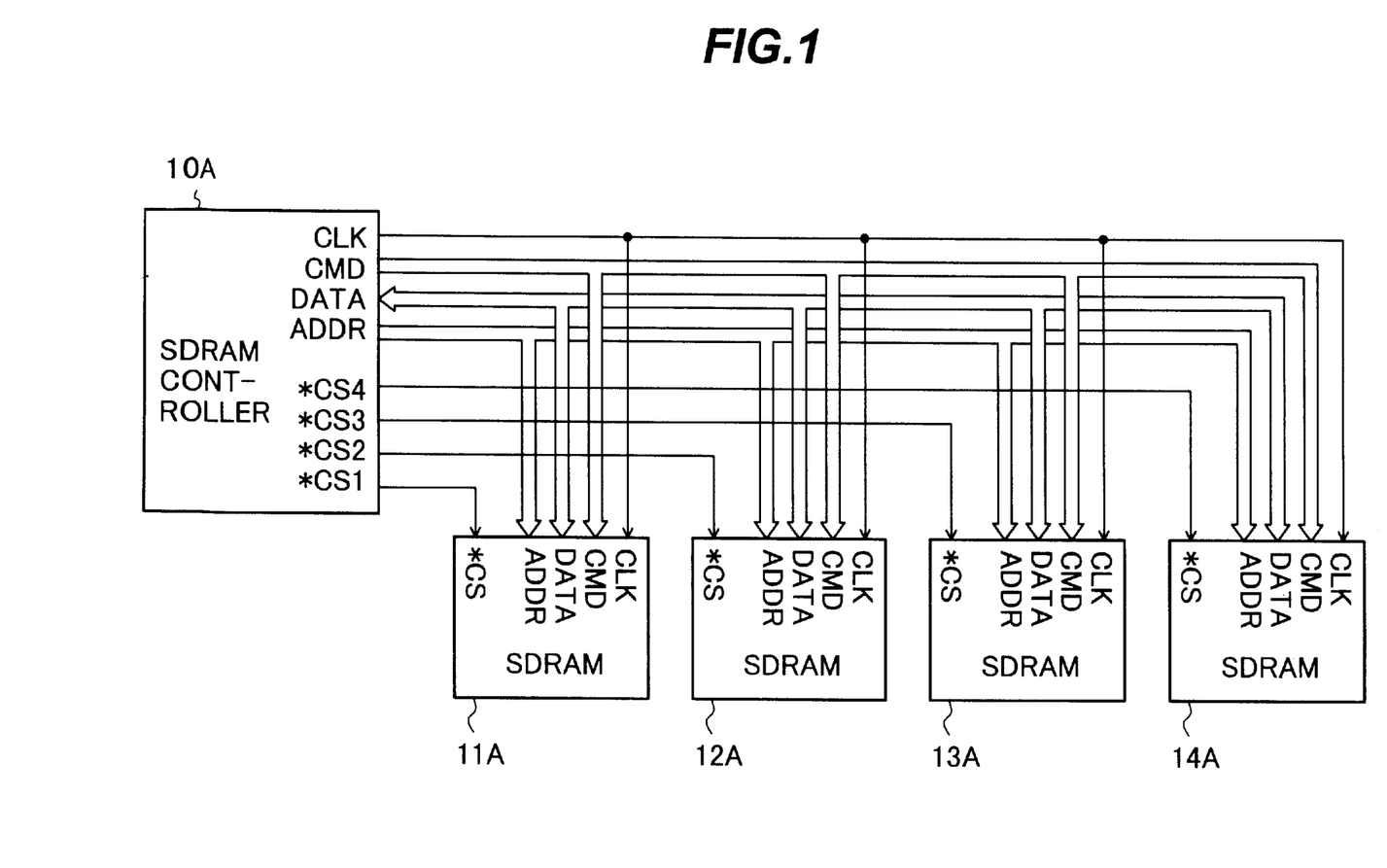
FIG. 1 is a wiring diagram between a SDRAM controller and a plurality of SDRAMs of the first embodiment according to the present invention.
Figure 2:
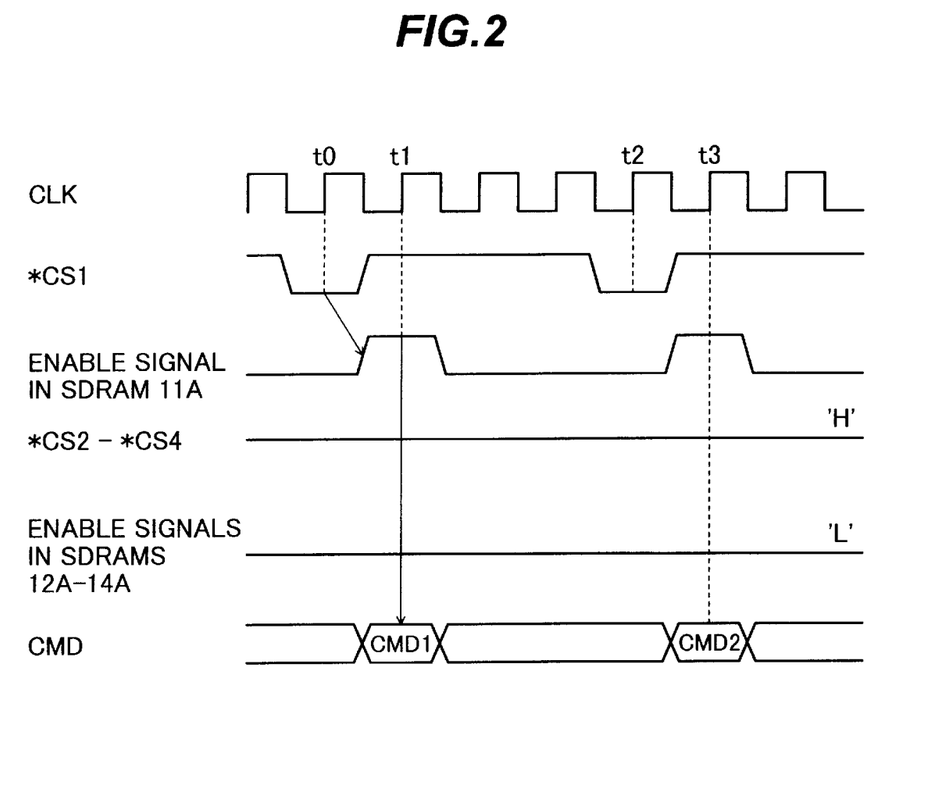
FIG. 2 is a schematic timing chart showing operation of the circuit of FIG. 1.

FIG. 1 is a wiring diagram between a SDRAM controller 10A and a plurality of SDRAMs 11A to 14A of the first embodiment according to the present invention, which is similar to FIG. 9. FIG. 2 is a schematic timing chart showing operation of the circuit of FIG. 1.

The SDRAM controller 10A is different from the SDRAM controller 10 of FIG. 9 in that the SDRAM controller 10A does not output the clock enable signal CKE and further, as shown in FIG. 2, the chip select signal *CS1 is low (active) at time points t0 and t2 on the rises in the clock CLK one cycle prior to issuance of the commands CMD1 and CMD2 at time points t1 and t3, respectively. The other points of the SDRAM controller 10A is the same as the SDRAM controller 10.

The SDRAMs 11A to 14A are of the same configuration as each other and different from the SDRAMs 11 to 14 of FIG. 9 in that each of the SDRAMs 11A to 14A has no external terminal for the clock enable signal, internally generates an enable signal as shown in FIG. 2 in response to activation (low) of its signal input *CS, activates the internal clock in response to the internal enable signal so as to activates the input circuit. The other points of the SDRAMs 11A to 14A are same as those of the SDRAMs 11 to 14 of FIG. 9.

The reason why the chip select signal *CS is activated one clock cycle prior to issuance of the commands CMD1 and CMD2 is to surely latch such a command CMD at the timing on a rise of the internal clock in the next clock cycle. In FIG. 2, only the SDRAM 11A is selected, enable signals EN in SDRAMs 12A to 14A are low (inactive) and thereby the internal clocks thereof stop, resulting in that the input circuits thereof get inactive and the commands CMD and so on are not taken into the input circuits thereof.

Figure 3:
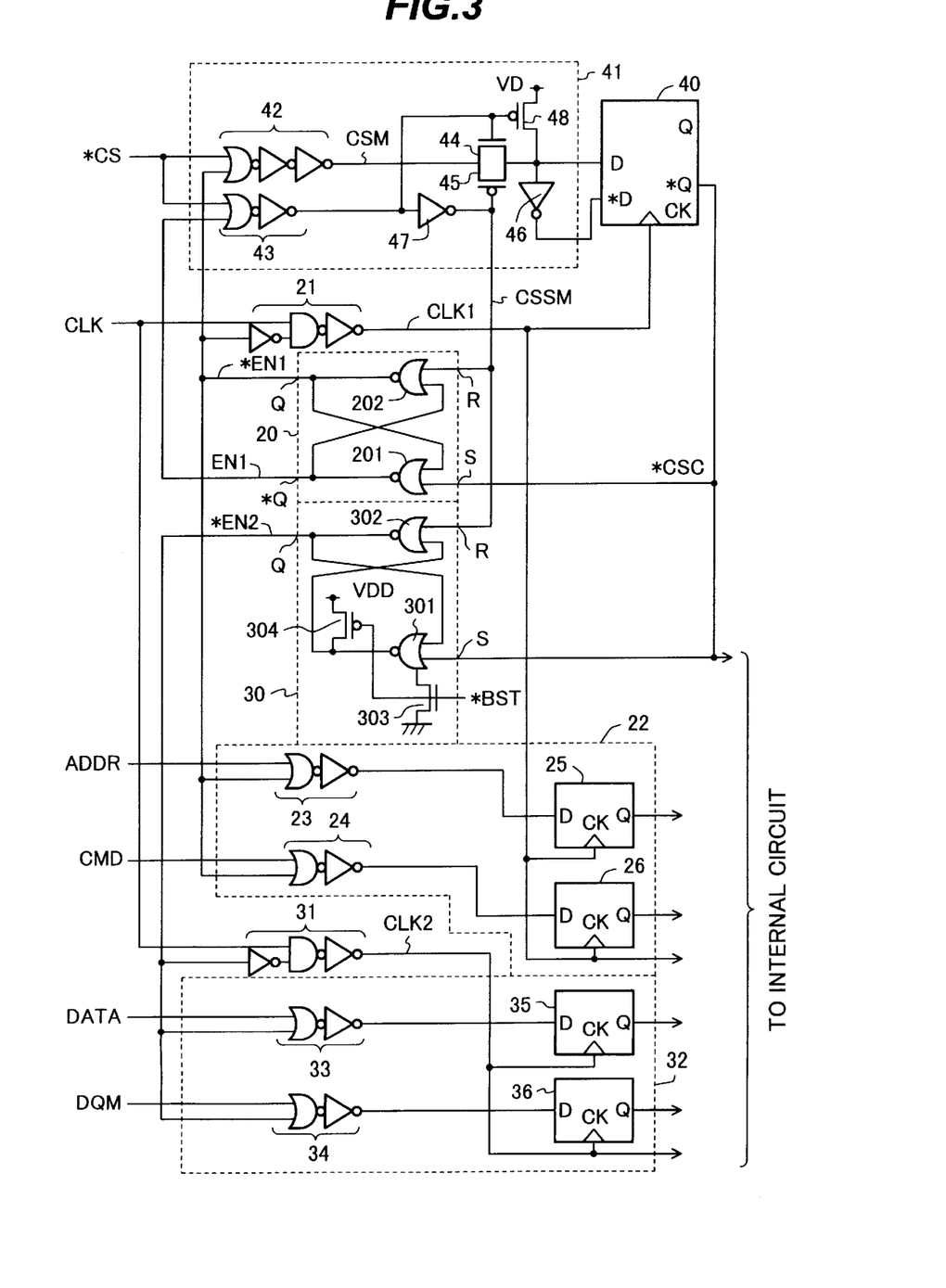
FIG. 3 is a diagram showing an input circuit of one SDRAM of FIG. 1.

FIG. 3 shows an input circuit of one SDRAM of FIG. 1. In FIG. 3, for simplicity, there is shown a case where an address ADDR, a command CMD, DATA and a data mask DQM are all of 1 bit. In a case of multiple bits, input circuits corresponding to the respective bits thereof are present in parallel.

An enable signal *EN1 generated based on the chip select signal *CS by synchronizing with a rise of the external clock CLK is held in an RS flip-flop 20, taken out from the non-inverted output Q thereof and provided to an input of a clock input circuit 21 and one inputs of OR gates 23 and 24 of an address/command input circuit 22. To the other inputs of the clock input circuit 21 and the OR gates 23 and 24, the external clock CLK, the address ADDR and the command CMD, respectively, are provided. The outputs of the OR gates 23 and 24 are provided to the data inputs D of D flip-flops 25 and 26 of the address/command input circuit 22, and the output of the clock input circuit 21 is provided to the clock inputs CK of D flip-flops 25 and 26 as an internal clock CLK1.

When the enable signal *EN1 is high, the output of the clock input circuit 21 is low independently of changes in the external clock CLK and both the outputs of the OR gates 23 and 24 are high independently of changes in the address ADDR and the command CMD, therefore the address/command input circuit 22 is inactive. When the enable signal *EN1 is low, the external clock CLK, the address ADDR and the command CMD pass through the clock input circuit 21 and the OR gates 23 and 24, respectively, therefore the address/command input circuit 22 is active. The outputs of the D flip-flop 25 and 26 are provided to an internal circuit not shown.

In the meantime, when the SDRAM 11A is in a burst mode, a column address with the same row address is latched in a counter not shown, thereafter the count which is the internal row address is incremented by the internal clock with leading the DATA and the data mask DQM into the internal circuit. During this, the address/command circuit 22 is inactive, namely the enable signal *EN1 is inactive. Therefore, in addition to the RS flip-flop 20, an RS flip-flop 30 is provided to hold another enable signal *EN2.

The RS flip-flop 30 has a configuration of cross connection between NOR gates 301 and 302, which has the same configuration as the RS flip-flop 20, and further comprises an NMOS transistor 303 connected between the ground potential input of the NOR gate 301 and a ground line, and a pMOS transistor 304 connected between the output of the NOR gate 301 and a power supply potential VDD. To the gates of the nMOS transistor 303A and the pMOS transistor 304, a burst signal *BST is provided. The output of the NOR gate 301 is in a high impedance state when the nMOS transistor 303 is off and the set input S of the RS flip-flop 30 is high. In the burst mode, the burst signal *BST is low, and therefore the nMOS transistor 303 and the pMOS transistor 304 are off and on, respectively, and the non-inverted output Q is fixed low even if the set input S is high. When the burst signal *BST is high, the nMOS transistor 303 and the pMOS transistor 304 are on and off, respectively, and a NOR gate 301 is in an active state.

The enable signal *EN2 taken out from the nonconverting output Q of the RS flip-flop 30 is provided to one inputs of a clock input circuit 31, OR gates 33 and 34 of a data input circuit 32. The external clock CLK, the data DATA and the data mask DQM are provided to the other inputs of the clock input circuit 31 and the OR gates 33 and 34, respectively. The outputs of the OR gates 33 and 34 are provided to the data inputs D of D flip-flops 35 and 35, respectively, of the data input circuit 32, and the output of the clock input circuit 31 is provided to the clock inputs CK of D flip-flops 35 and 36 as an internal clock CLK2.

When the enable signal *EN2 is high, the output of the clock input circuit 31 is low independently of changes in the external clock CLK, and the outputs of the OR gates 33 and 34 are high independently of changes in the DATA and the data mask DQM, respectively, therefore the data input circuit 32 is inactive. When the enable signal *EN2 is low, the external clock CLK, the DATA and the data mask DQM pass through the clock input circuit 31 and the OR gates 33 and 34, respectively, therefore the data input circuit 32 is active. The outputs of the D flip-flops 35 and 36 are provided to the internal circuit.

A chip select signal *CSC is provided from the inverted output *Q of a D flip-flop 40 to the set inputs S of the RS flip-flops 20 and 30. The chip select signal *CS is provided through a timing circuit 41 to the complementary data inputs D and *D of the D flip-flop 40. The D flip-flop 40 is used for setting RS flip-flops 20 and 30 in synchronization with the timing on the first rise of the external clock CLK after the chip select signal *CS has gone high.

In the meantime, there are two problems.

One is that when the signal, which is obtained by inverting the chip select signal *CS of the logic high level in the timing circuit 41, is held in the D flip-flop 40 on the rise of the internal clock CLK1, the chip select signal *CSC from the output *Q thereof goes high, the RS flip-flop 20 is set, the enable signal *EN1 goes high, the clock input circuit 21 is closed and the internal clock CLK1 stops. Hence, even if the chip select signal *CS goes low, this is not held in the D flip-flop 40. Therefore the RS flip-flop 20 cannot be reset by the non-inverted output Q of D flip-flop 40.

The other is that if the RS flip-flop 20 is reset on the fall of the chip select signal *CS when the external clock CLK is high, then the clock input circuit 21, and the OR gates 23 and 24 are activated and at the same time, the logic high level of the CLK passes through the clock input circuit 21, and thereby the internal clock CLK1 rises, resulting in that the operation of the address/command input circuit 22 advances by one clock cycle.

Therefore, the timing circuit 41 equipped with constituents 42 to 48 is adopted to solve such problems.

In the timing circuit 41, the chip select signal *CS is provided to one inputs of NOR gates 42 and 43 and the enable signals *EN1 and EN1 from the RS flip-flop 20 are provided to the other inputs thereof, respectively. The OR gates 42 and 43 are used for detecting deactivation (transition to the logic high state) of the chip select signal *CS and activation (transition to the logic low state) thereof, respectively. The output of the NOR gate 42 is provided through a transfer gate having an nMOS transistor 44 and a pMOS transistor in parallel connection, on one hand, to the data input D of the D flip-flop 40, and on the other hand to the data input *D of the D flip-flop 40 through an inverter 46. The output of the OR gate 43 is provided directly to the gate of the nMOS transistor 44 and to the gate of the pMOS transistor 45 through an inverter 47. The output of the OR gate 43 is further provided to the gate of a pMOS transistor 48 which is connected between the power supply potential VDD and the data input D of the D flip-flop 40. The output of the inverter 47 is provided to the reset inputs of the RS flip-flops 20 and 30 as a chip select signal CSSM.

In the above described configuration, when the enable signal *EN1 is high and thereby the NOR gate 42 is inactive (CSM is fixed to low) and the OR gate 43 is active, if the output of the OR gate 43 goes low, the pMOS transistor 48 is turned on, the data inputs D and *D of the D flip-flop 40 go high and low, respectively, while the output of the inverter 47 goes high and thereby the RS flip-flops 20 and 30 are reset. The nMOS transistor 44 and the pMOS transistor 45 are used for avoiding a conflict between the signal CSM and the data input D of the D flip-flop 40 by forcing both these to be off since the signal CSM is low and the data input D of the D flip-flop 40 is high.

A chip select signal input circuit is constructed of the timing circuit 41, the D flip-flop 40, and the RS flip-flops 20 and 30.

Figure 5:
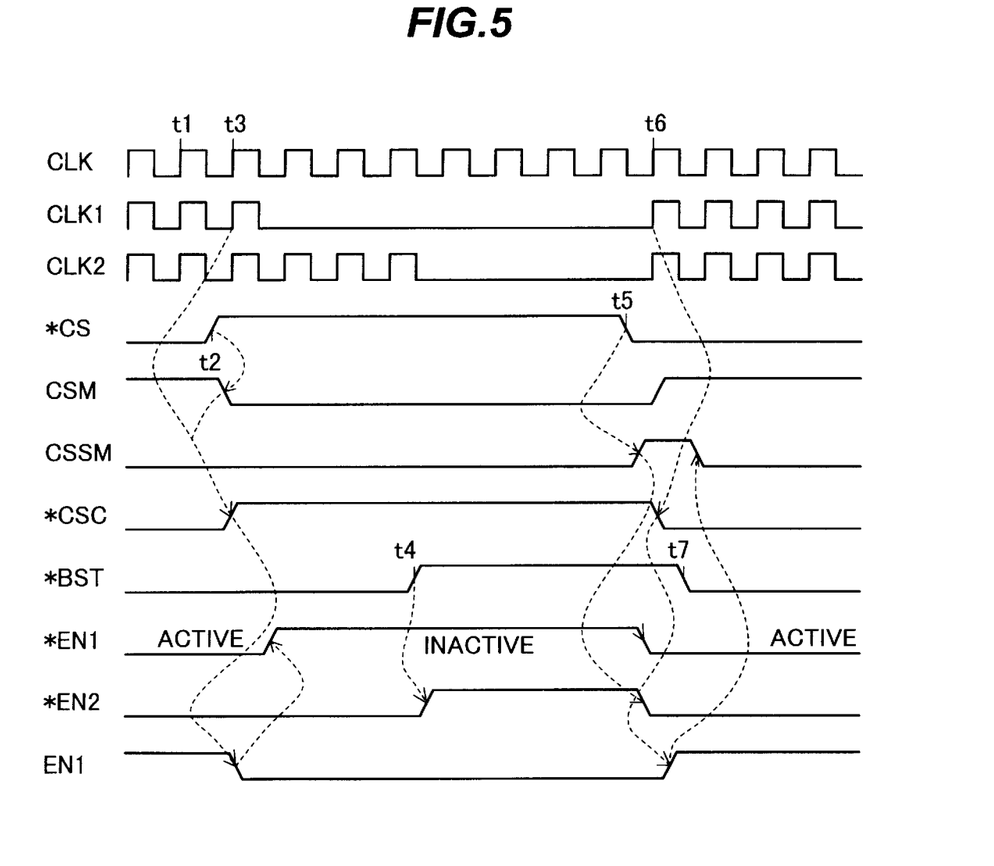
FIG. 5 is a timing chart showing operation of the circuit of FIG. 3.

Referring to FIG. 5, operation of the input circuit configured as above will be described below.

In FIG. 5, the reason why the chip select signal *CS maintains low (active) over plural clock cycles, which is different form FIG. 2, is as follows. That is, because in SDRAM, there is a case where after a command is provided to a bank, a command is provided to another bank in the next cycle, or a case where one bit read commands are sequentially provided to the same bank. As will be described later about FIG. 8, when the chip select signal *CS is active one cycle prior to the present rise of the clock CLK, that is, when the internal chip select signal *CSC is active on the rise, the command CMD is decoded in synchronization with the rise of a internal clock and operation corresponding to the decoded result is performed.

(t1) Since the enable signal *EN1 is low, the NOR gate 42 functions as an inverter for the chip select signal *CS. Since the chip select signal *CS is low, the output signal CSM of the NOR gate 42 is high. Since the enable signals *EN1 and *EN2 are low, the clock input circuit 21, the OR gates 23 and 24, the clock input circuit 31, and the OR gates 33 and 34 are active, and therefore the address/command input circuit 22 and the data input circuit 32 are also active. Further, since the enable signal EN1 is high, the OR gate 43 is inactive, that is, the output thereof is high independently of changes in the chip select signal *CS, thereby the nMOS transistor 44 and the pMOS transistor 45 are on, the pMOS transistor 48 is off, and the logic high and low levels are respectively provided to the data inputs D and *D of the D flip-flop 40. The output signal CSSM of the inverter 47 and the inverted output *Q of the D flip-flop 40 are low, that is, the reset inputs R and the set inputs S of the RS flip-flops 20 and 30 are all low. The burst signal *BST is low (in the burst mode), and thereby the nMOS transistor 303 and the pMOS transistor 304 are off and on, respectively.

(t2) From this state, the chip select signal *CS rises, the output signal CSM of the NOR gate 42 goes low and the data inputs D and *D go low and high, respectively.

(t3) Then, the external clock CLK rises, the internal clock CLK1 rises, the input state of the D flip-flop 40 is latched, and the chip select signal *CSC from the inverted output *Q thereof goes high. The chip select signal *CSC of the logic high level inverts the output signal ENS of the NOR gate 201 in the RS flip-flop 20 to a low and then inverts the output signal *EN1 of the NOR gate 202 to a high, therefore the RS flip-flop 20 functions as a delay circuit as well. With this delay in signal propagation, the enable signal *EN1 goes high and the clock input circuit 21 get inactive after a pulse of the CLK1 passes through the clock input circuit 21.

The address ADDR and the command CMD are latched in the D flip-flops of the address/command input circuit 22 in synchronization with the rise of the CLK1. Since the *BST is low, the address ADDR is a column address and the command CMD is a read or a write command.

When the enable signal *EN1 goes high, not only the clock input circuit 21, but also the OR gates 23 and 24 get inactive, and thereby the internal clock CLK1 stops and the address/command circuit 22 get inactive as well. Further, the OR gate 43 gets active at the same time when the NOR gate gets inactive, and the fall of the chip select signal *CS which will occur later does not pass through the NOR gate 42 but passes through the OR gate 43. The output of the OR gates 43 remains high.

Since the burst signal *BST is low, the enable signal *EN2 remains low even if the chip select signal *CSC goes high, that is, the clock input circuit 31 and the data input circuit 32 remain active. Thereby, operation in the burst mode is performed, and data corresponding to contents of the DATA and the data mask DQM are written in the interior. When the output of the D flip-flop 36 is high, the output of the D flip-flop 35 is masked by the internal circuit, and write into a memory cell at a designated address is not performed. When the output of the D flip-flop 36 is low, the mask is removed, and the output of the D flip-flop 35 is written into a memory cell at a designated address.

(t4) The burst mode is terminated with the burst signal *BST going high, and thereby the logic high level provided to the set input S of the RS flip-flop 30 gets effective and the enable signal *EN2 goes high, which deactivates the clock input circuit 31, and the OR gates 33 and 34 and stops the internal clock CLK2. As a result, column address related circuits not shown get inactive.

(t5) The chip select signal *CS goes low, the outputs of the OR gate 43 and the inverter 47 go low and high, respectively, and the nMOS transistor 44 and the pMOS transistor 45 are both turned off, while the pMOS transistor 48 is turned on. With this, the signal CSSM goes high to reset the RS flip-flops 20 and 30, the enable signals *EN1 and *EN2 go low, the NOR gate 42, the clock input circuits 21, the OR gates 23 and 24, the clock input circuit 31, and the OR gates 33 and 34 are activated, the internal clocks CLK1 and CLK2 start and the NOR gate 42, the address/command input circuit 22 and the data input circuit 32 are activated. By the activation of the NOR gate 42, the signal CSM goes high.

With such operation, the enable signals *EN1 and *EN2 are activated in response to the activation (fall) of the chip select signal *CS even with the internal clocks CLK1 and CLK2 at rest, and thereby the internal clocks CLK1 and CLK2 restart.

(t6) Since the data inputs D and *D of the D flip-flop 40 are high and low, respectively, the D flip-flop 40 is set in synchronization with the rise of the internal clock CLK1, and the chip select signal *CSC goes low. Thereby, the enable signal EN1 goes high, the OR gate 43 is deactivated with the output thereof going high, the nMOS transistor 44 and the pMOS transistor 45 are turned on, while the pMOS transistor 48 is turned off, and the signal CSSM goes low.

Since the internal clock *CSC is high on the rise of the internal clock CLK1, the command CMD is not decoded.

(t7) The burst signal *BST goes low, and the state of the circuit of FIG. 3 becomes same as that at the time point t1.

According to the first embodiment, the internal clock CLK1 is on if the chip select signal *CS is active (low) one cycle prior to the present rise of the clock CLK, and when the internal chip select signal *CSC is active, the command CMD is taken into the internal circuit on the rise of the internal clock CLK1, and operation corresponding to the CMD is performed. Further, since the internal clock CLK1 stops one clock pulse after the chip select signal *CS is deactivated (high), and the address/command circuit 22 is deactivated, and in addition, the internal clock CLK2 stops after taking-in of data in the burst mode has been completed, and the data input circuit 32 is deactivated, power consumption of the input circuit is reduced even in the selected SDRAM 11. Furthermore, since the chip select signal *CS is high in the non-select SDRAM 11, the internal clock stops and power consumption of the input circuit thereof is reduced. Since such operation is automatically performed with no use of the clock enable signal CKE, not only low power consumption is achieved, but also control and design of a system with plural SDRAMs become easy.

Figure 4:
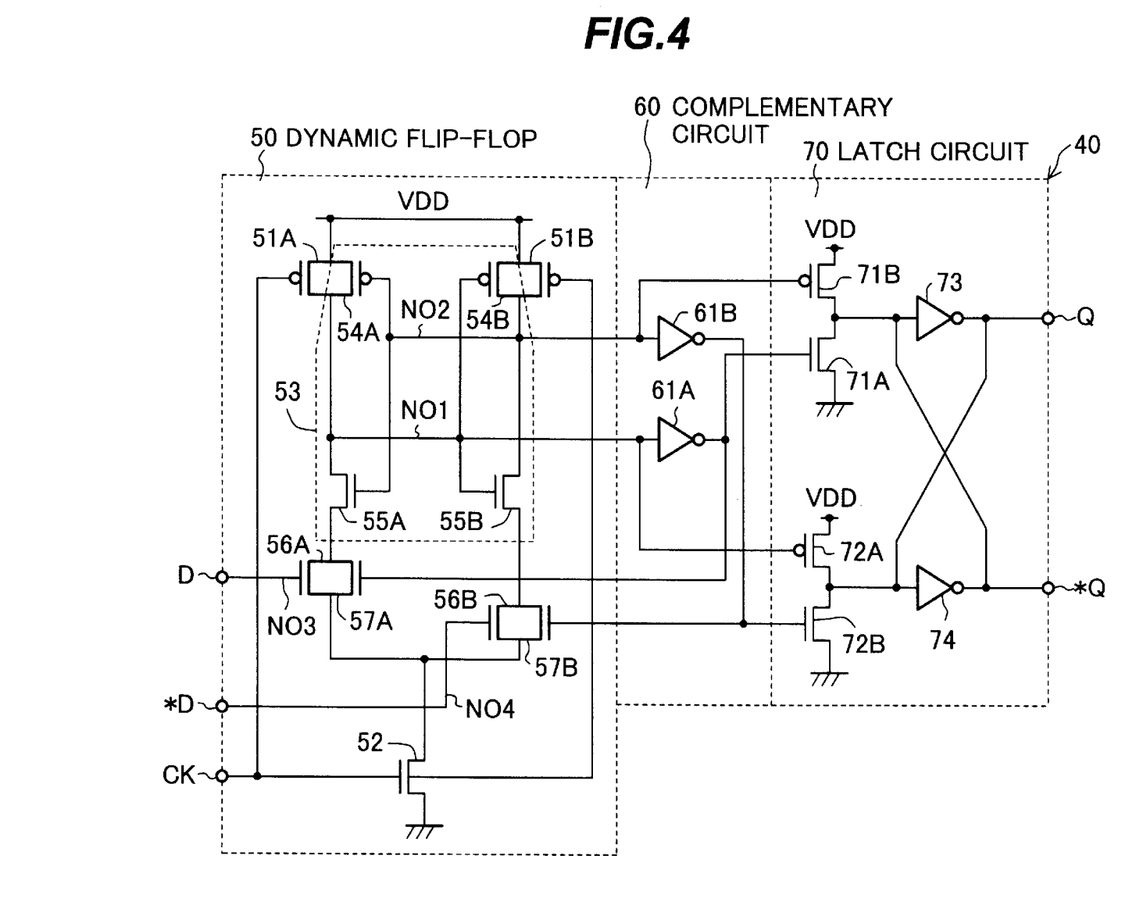
FIG. 4 is a circuit diagram showing a configuration of the D flip-flop of FIG. 3.

FIG. 40 shows an embodiment of the D flip-flop 40 of FIG. 3. Although this circuit itself is known, the configuration of the circuit will be described together with the operation thereof in order to show useless power consumption by the pulse train of a clock signal.

The D flip-flop 40 includes a dynamic flip-flop 50 in the input stage, a complementary circuit 60 for complementing each of a pair of outputs of the dynamic flip-flop 50 and for feedback control of the dynamic flip-flop 50, and a latch circuit 70 whose state is controlled by the outputs of the circuit 60.

In the dynamic flip-flop 50, when CK is low, pMOS transistors 51A and 51B are on while an nMOS transistor 52 is off, and precharge is performed onto nodes NO1 and NO2.

An amplifier circuit 53 is of a flip-flop type and includes pMOS transistors 54A and 54B connected to the pMOS transistors 51A and 51B in parallel, respectively, and nMOS transistors 55A and 55B connected to the pMOS transistors 54A and 54B in series, respectively, wherein the transistors are configured in cross connection. With the precharge onto the nodes NO1 and NO2, the pMOS transistors 54A and 54B are turned off, while the nMOS transistors 55A and 55B are turned on, making the amplifier circuit 53 inactive.

NMOS transistors 56A and 57A are connected in parallel between the source of the nMOS transistor 55A and the drain of the nMOS transistor 52, and nMOS transistors 56B and 57B are connected in parallel between the source of the nMOS transistor 55B and the drain of the nMOS transistor 52. The node NO1 is connected through an inverter 61A of the complementary circuit 60 to the gate of the nMOS transistor 57A, and the node NO2 is connected through an inverter 61B of the complementary circuit 60 to the gate of the nMOS transistor 57B. Therefore, in a state where the nodes NO1 and NO2 are precharged, the outputs of the inverters 61A and 61 B are low and the nMOS transistors 57A and 57B are off. Signals from the data inputs D and *D are provided to the gates of the nMOS transistors 56A and 56B, respectively. When the logic levels of the data inputs D and *D are inverse to each other, one of the nMOS transistors 56A and 56B is on and the other is off. Assume that the data input D and *D are high and low, and the nMOS transistor 56A is on while the nMOS transistor 56B is off.

In the above described precharged state, in the latch circuit 70, an nMOS transistor 71A, pMOS transistors 71B and 72A and an nMOS transistor 72B are all off, and the previous state is held in a holding circuit constructed of inverters 73 and 74.

From this state, when the external clock CLK rises, the pMOS transistors 51A and 51B are turned off, the nMOS transistor 52 is turned on, charge on the node NO0 is extracted through the nMOS transistors 55A, 56 A and 52 to the ground line to pull down the potential of the node NO1, the potential difference between the node NO1 and NO2 are amplified by the amplifier circuit 53, the output of the inverter 61A goes high, the nMOS transistor 57A is turned on and the extract operation of the charge on the node NO1 is encouraged. Further, the nMOS transistor 71A and the pMOS transistor 72A are turned on, and the outputs Q and *Q go high and low, respectively.

On the contrary, when the data input D is low, the nMOS transistors 56A and 57A are off, the nMOS transistors 56B and 57B are on, the pMOS transistor 71B and the nMOS transistor 72B are on and the outputs Q and *Q are low and high, respectively.

Next, when CK goes low, the above described precharge is performed, the pMOS transistor 71B, the nMOS transistor 71A, the pMOS transistor 72A and the nMOS transistor 72B are all off, and thereby the potentials of the outputs Q and *Q are latched.

If a pulse train is provided to the clock input CK when the data input D is high, although the outputs Q and *Q remain constantly high and low, respectively, precharge and discharge of the node NOI are repeated, leading to wasteful power consumption. In FIG. 5, since the internal clocks CK1 and CK2 stop when pulses thereof becomes unnecessary, thereby reducing power consumption.

Even if the data input D changes when CK is high, since the output of the amplifier circuit 53 is held by its amplifying function, the output of the D flip-flop 40 also remains constant.

Second Embodiment

Figure 6:
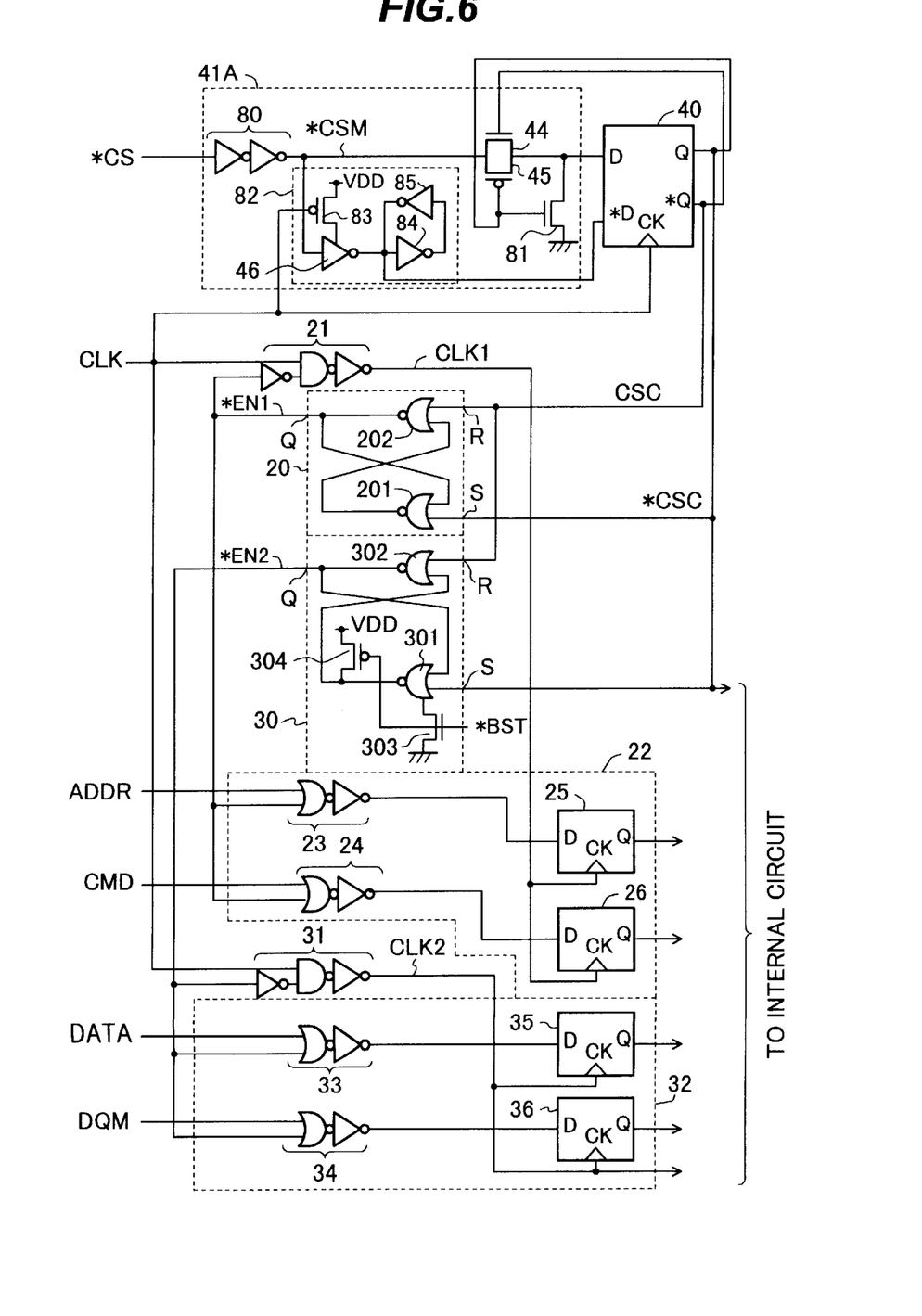
FIG. 6 is a diagram showing an input circuit in an SDRAM of the second embodiment according to the present invention.

FIG. 6 shows an input circuit in a SDRAM of the second embodiment according to the present invention, which is similar to FIG. 3. In the circuit, a timing circuit 41A is employed instead of the timing circuit 41 of FIG. 3, the external clock CLK is directly provided to the clock input CK of the D flip-flop 40, the non-inverted output Q of the D flip-flop 40 is connected to the set inputs S of the RS flip-flops 20 and 30, and the inverted output *Q thereof is connected to the reset inputs R of the RS flip-flops 20 and 30.

In the timing circuit 41A, a drive ability of the chip select signal *CS is amplified by a true buffer gate 80, and the output signal *CSM thereof is provided to the data input D of the D flip-flop 40 through the transfer gate having the nMOS transistor 44 and the pMOS transistor 45 connected in parallel. The nMOS transistor 81 is connected between the data input D and a ground line. The gate of the nMOS transistor 44 is connected to the inverted output *Q of the D flip-flop 40, and the gates of the pMOS transistor 45 and the NMOS transistor 81 are connected to the non-inverted output Q of the D flip-flop 40. Thereby, when the outputs Q and *Q are low and high, respectively, the nMOS transistor 44 and the pMOS transistor 45 are on while the nMOS transistor 81 is off, and the chip select signal *CS of the low level is provided to the data input D of the D flip-flop 40 through the true buffer gate 80, the nMOS transistor 44 and the pMOS transistor 45.

When the chip select signal *CS goes high from this state, the chip select signal *CS is held in the D flip-flop 40 in synchronization with the rise of the external clock CLK, the outputs Q and *Q go high and low, respectively, the nMOS transistor 44 and the pMOS transistor 45 are turned off while the nMOS transistor 81 is turned on, and the data input D of the D flip-flop 40 goes low. In FIG. 4, when the CK is low, the pMOS transistors 51A and 51B are on while the nMOS transistor 52 is off, the nodes NO1 and NO2 are precharged, and thereby the nMOS transistors 55A and 55B are on while the nMOS transistors 57A and 57B are off. Since the nMOS transistors 56A and 56B are off if the data inputs D and *D are both low, discharge doesn't occur even if the external clock CLK goes high. Therefore wasteful power consumption is prevented even if a pulse train of the external clock CLK is provided to the CK of the D flip-flop 40.

When the chip select signal *CS goes low, only the data input *D is required to go high since the data input D of the D flip-flop 40 is already made low by the on-state of the nMOS transistor 81. When the data input *D goes high while the external clock CLK is high, the output of the D flip-flop 40 is immediately inverted, leading to malfunction since in FIG. 4, charge on the node NO2 is extracted through the nMOS transistors 55B, 56B and 52. In order to solve this problem, the output *CSM of the true buffer gate 80 is connected to the data input *D of the D flip-flop 40 through a fall-synchronized inverter 82. The fall-synchronized inverter 82 is used for inverting the input of the inverter 46 in synchronization with the fall of the external clock CLK. The inverter 46 is connected between the output of the true buffer inverter 80 and the data input *D of the D flip-flop 40, the power supply input thereof is connected to the power supply potential VDD through the pMOS transistor 83, and the gate of the pMOS transistor 83 is connected to the external clock CLK. When the external clock CLK is low, the fall-synchronized inverter 82 functions as a normal inverter since the pMOS transistor 83 is on. When the external clock CLK is high, the pMOS transistor 83 is off and the output of the inverter 46 does not respond to changes in its input. Therefore, in order to hold the output of the inverter 46 at the time when the external clock CLK goes high, a holding circuit constructed of the inverters 84 and 85 in ring connection is connected to the output of the inverter 46.

The other configuration of the circuit of FIG. 6 is the same as that of FIG. 3.

Figure 7:
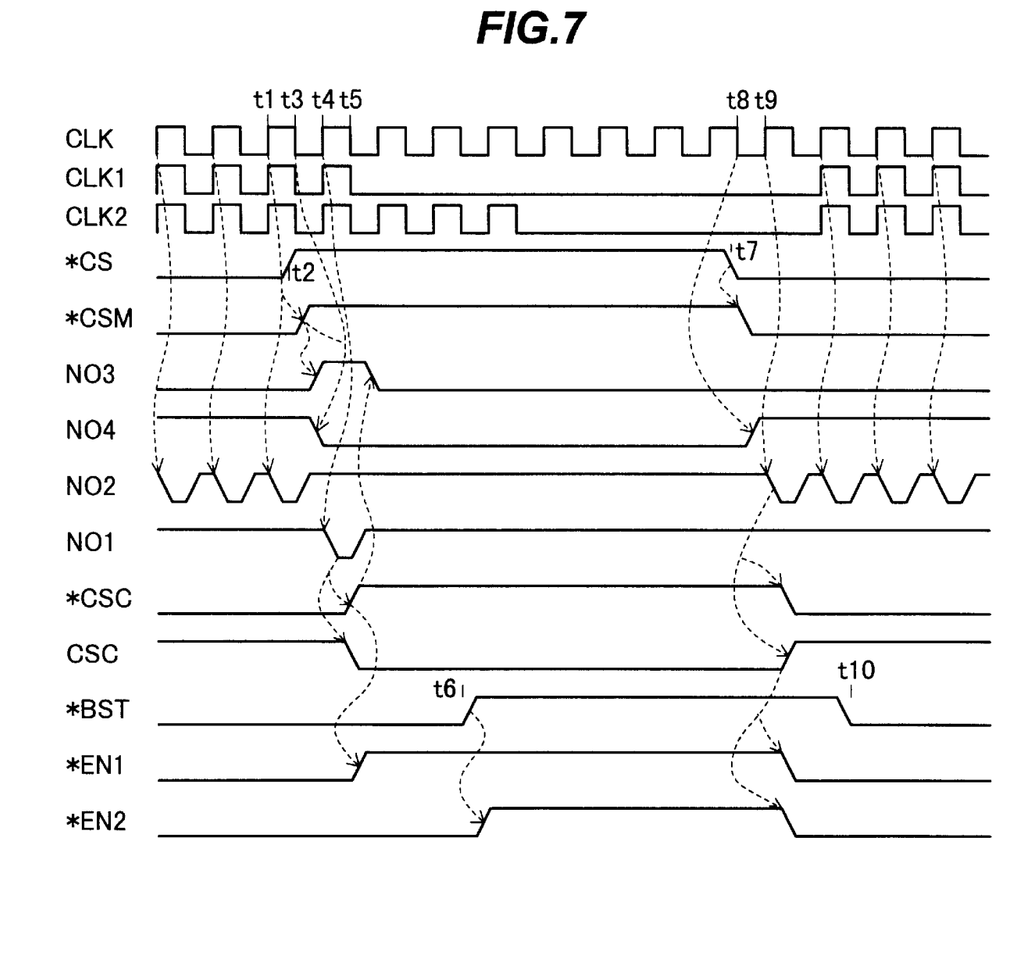
FIG. 7 is a timing chart showing operation of the circuits of FIGS. 6 and 4.

FIG. 7 is a timing chart showing operation of the circuit of FIG. 6.

FIG. 7 shows a case where the chip select signal *CS is low prior to the time point t1 and held in the D flip-flop 40, the signals *CSC and CSC from the outputs Q and *Q are low and high, respectively, and the RS flip-flops 20 and 30 are in the reset state. Accordingly, the enable signals *EN1 and *EN2 are low, the clock input circuit 21, the OR gates 23 and 24, the clock input circuit 31, and the OR gates 33 and 34 are all active, the internal clocks CLK1 and CLK2 are on, and the address/command input circuit 22 and the data input circuit 32 are active. Further, since the outputs Q and *Q of the D flip-flop 40 are low and high, respectively, the nMOS transistor 44 and the pMOS transistor 45 are on while the NMOS transistor 81 is off. Since the data inputs D and *D of the D flip-flop 40 are low and high, respectively, the nMOS transistors 56A and 56B of FIG. 4 are off and on, respectively.

(t1) According to the rise of the external clock CLK, in FIG. 4, the clock input CK goes high, and charge on the node NO2 is extracted to the ground line through the nMOS transistors 55B, 56B and 52. On the other hand, the node NO1 remains high since the NMOS transistors 56A and 57A are off.

(t2) The chip select signal *CS goes high, the output *CSM of the true buffer gate 80 goes high, the node N03 of FIG. 4 goes high, and the nMOS transistor 56A is turned on. The node NO1 remains high since the nMOS transistor 55A is off.

(t3) The external clock CLK goes low, the pMOS transistor 83 is turned on, the chip select signal *CSM is inverted by the inverter 46, the node NO4 of FIG. 4 goes low and the nMOS transistor 56B is turned off.

(t4) The address ADDR and the command CMD are held in the D flip-flop of the address/command input circuit 22 in synchronization with the rise of the internal clock CLK1.

On the rise of the external clock CLK, the high level of the chip select signal *CS is latched in the D flip-flop 40, and its outputs Q and *Q go high and low, respectively. Thereby, the RS flip-flop 20 is set, the enable signal *EN1 goes high, and the clock input circuit 21, and the OR gates 23 and 24 are deactivated. In regard to the RS flip-flop 30, since the burst signal *BST is low, the enable signal *EN2 is held low and the data input circuit 32 remains active. Further, the nMOS transistor 44 and the pMOS transistor 45 are turned off while the nMOS transistor 81 is turned on, the node NO3 of FIG. 4 goes low and the nMOS transistor 56A is turned off.

(t5) On the fall of the external clock CLK, in FIG. 4, the PMOS transistors 51A and 51B are turned on while the nMOS transistor 52 is turned off, the node NO1 is precharged and the amplifier circuit 53 is deactivated. In this state, since the nMOS transistors 56A, 57A, 56B and 57B are off, the nodes NO1 and 2 are not discharged even if the external clock CLK changes, thereby preventing wasteful power consumption in the D flip-flop 40.

(t6) The burst mode is terminated with the burst signal *BST going high, thereby the logic high level provided to the set input of the RS flip-flop 30 gets effective, the enable signal *EN2 goes high, the clock input circuit 31, and the OR gates 33 and 34 are deactivated and the internal clock CLK2 stops. As a result, the column address related circuit is deactivated.

(t7) The chip select signal *CS falls and the output *CSM of the true buffer gate 80 also falls. With this, since the pMOS transistor 83 is off even if the external clock CLK is high and the nMOS transistor 52 is on, the output of the inverter 46 is in the high impedance state, the node NO4 remains low, the nMOS transistor 56B remains off and the D flip-flop 40 holds the set state. Therefore, it is prevented that the address/command input circuit 22 is erroneously activated in response to the fall of the chip select signal *CS without synchronizing with the external clock CLK.

(t8) By the fall of the external clock CLK, the pMOS transistor 83 is turned on, thereby the inverter 46 is activated, the node NO4 goes high and the nMOS transistor 56B is turned on. Simultaneously, the nMOS transistor 52 is turned off, therefore the node NO2 remains high.

(t9) On the rise of the external clock CLK, the pMOS transistors 51A and 51B are turned off while the nMOS transistor 52 is turned on, charge on the node NO2 is extracted through the nMOS transistors 55B, 56B and 52 to the ground line, a potential difference between the nodes NO1 and NO2 is amplified by the amplifier circuit 53 and the node NO2 goes low. Thereby, the output Q and *Q go low and high, respectively, the RS flip-flops 20 and 30 are reset, the enable signals *EN1 and *EN2 go low, and the clock input circuits 21, 23 and 24, the clock input circuit 31, and the OR gates 33 and 34 are activated.

The time point t9 corresponds to the time point t6 of FIG. 5, but the situation is different from FIG. 5 in that the internal clock CLK 1 is at rest. However, in both cases of FIGS. 5 and 7 at the next rise of the clock CLK, since the internal chip select signal *CSC is active and the internal clock CLK1 rises, a decode starting time point of the command CMD is the same in both cases as will be described below in connection with FIG. 8.

(t10) The burst signal *BST goes low and the current state is the same as prior to the time point t1.

Effects similar to the first embodiment can be achieved in the second embodiment as well.

There is a further effect in the second embodiment that the current consumption of the timing circuit 41A is reduced more than the timing circuit 41 of FIG. 3. That is, in FIG. 3, the OR gate 43 is usually constructed of a differential amplifier having the load of a current mirror circuit, and in this case, even if the *CS is high and the EN1 is low, a DC current flows from the VDD to the ground in the OR gate 43. While, in FIG.6, the true buffer circuit 80 can be omitted, and in this case, when the *CS is high, the FETs 44 and 45 are off. When the CLK is high, the FET 83 is off. Therefore, the current consumption is reduced.

Third Embodiment

Figure 8:
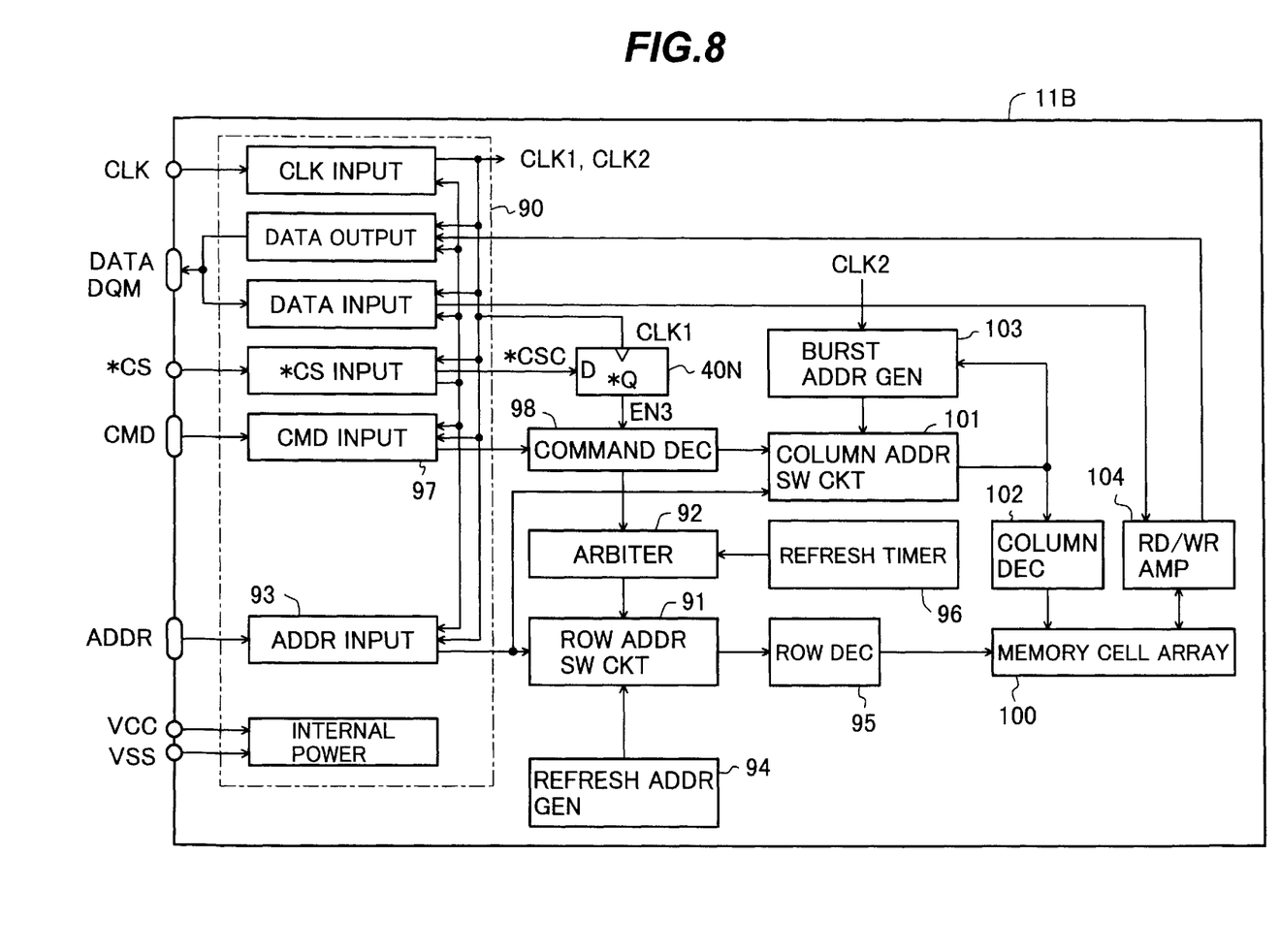
FIG. 8 is a schematic block diagram showing an SDRAM of the third embodiment according to the present invention.

FIG. 8 is a schematic block diagram showing a SDRAM 11B of the third embodiment according to the present invention.

An input circuit 90 in c ludes the circuit shown in FIGS. 3 or 6. Although, in FIGS. 3 and 6, each of the address ADDR, the command CMD, the DATA and the data mask DQM is of 1 bit for simplicity, in the input circuit 90 of FIG. 8, those signals are of multiple bits. Further, in FIGS. 3 and 6, although the data output circuit is omitted, it is included in the input circuit 90 of FIG. 8.

A row address switching circuit 91 selects either a row address from an address input circuit 93 or a row address from a refresh address generation circuit 94 depending on a control signal from an arbiter 92, and provides the selected row address to a row decoder 95. The arbiter 92 accepts an earlier activated input provided from a refresh timer 96 or a command decoder 98. If the activated inputs are at the same time, then the arbiter 92 accepts a time-up signal provided from the refresh timer 96. When the arbiter 92 has received the activation of the time up signal, the arbiter 92 forces the row address switching circuit 91 to select the output of the refresh address generation circuit 94.

To the data input D and the clock input of a D flip-flop 40N as a decode enabling circuit, provided are the internal chip select signal *CSC and the internal clock CLK1 from a *CS input circuit and a clock input circuit, respectively, of the input circuit 90. The D flip-flop 40N provides an enable signal EN3 from its inverted output Q to a control input of the command decoder 98. A command signal from a command input circuit 97 of the input circuit 90 is provided to the command decoder 98, and when the enable signal EN3 is active (high), the command decoder 98 decodes the received command such as an activate command, a read command, a write command or a precharge command. That is, as described above, when the internal chip select signal *CSC is active, the command CMD is decoded on the rise of the internal clock CLK1 (the command decoder 98 is activated).

The activate command is provided to the arbiter 92 and when the arbiter 92 has accepted this, the arbiter 92 forces the row address switching circuit 91 to select the output of the address input circuit 93. A word line in a memory cell 100 is selected by the output of the row decoder 95, and the contents of the selected cell row are held in sense amplifiers within the memory cell array 100.

A column address switching circuit 101 receives an address as a column address from the address input circuit 93 when the output of the command decoder 98 indicates a read command or a write command, and in the burst mode, forces this address to be loaded on a column address counter within a burst address generation circuit 103. The counter is incremented by the internal clock CLK2 from the clock input circuit. The column address switching circuit 101 selects the output of the address input circuit 93 not in the burst mode, while selects the output of the burst address generation circuit 103 in the burst mode, and provides the selected address to the column decoder 102. A column in the memory cell 100 is selected by the output of the column decoder 102.

In a write operation, data from the data input circuit of the input circuit 90 is written through a read/write amplifier 104 into a cell of a selected row and column in the memory cell 100, while in a read operation, contents of the selected memory cell are fetched to the outside through the read/write amplifier 104 and the data output circuit of the input circuit 90. Although it is a known art in asynchronous RAM to select one of outputs of the address input circuit 93 and the refresh address generation circuit 94 by the row address switching circuit 91 using the arbiter 92, such a selection has not been employed in synchronous DRAM.

In the third embodiment, the input circuit 90 like the first and second embodiments is employed, the refresh timer 96 and the arbiter 92 are also employed, and a chip that is not selected by the chip select signal *CS is automatically not only powered-down, but also refreshed, whereby there is absolutely no need to pay attention to the non-selected chip. Hence, command provide is only required only for a chip to which access is desired and thereby, not only a system design in which such SDRAMs are incorporated is easy, but also a higher speed of system can be realized because of increase in time allocated for providing commands to a chip to which access is desired.

Although preferred embodiments of the present invention has been described, it is to be understood that the invention is not limited thereto and that various changes and modifications may be made without departing from the spirit and scope of the invention.

What is claimed is:

1. A synchronous semiconductor memory device comprising:
    a command input circuit, for latching an external command in synchronization with an internal clock; and
    a command decoder, for decoding said latched external command;
    a chip select signal input circuit, receiving an external chip select signal, for activating an enable signal in response to activation of said external chip select signal, for deactivating said enable signal in response to deactivation of said external chip select signal, for generating an internal chip select signal by synchronizing said external chip select signal with said internal clock;
    a clock input circuit, for outputting said internal clock depending on an external clock while said enable signal is active; and
    a decode enabling circuit, for generating a command decoder activating signal by synchronizing said internal chip select signal with said internal clock.

2. A synchronous semiconductor memory device according to claim 1, wherein said chip select signal input circuit deactivates said enable signal in response to deactivation of said external chip select signal after a next pulse of said external clock.

3. A synchronous semiconductor memory device according to claim 2, wherein said chip select signal input circuit comprises:
    a fist flip-flop, for latching said deactivated external chip select signal in synchronization with said internal clock to be a first state and outputting said first state as said internal chip select signal; and
    a delay circuit, for generating said enable signal by delaying an output of said first flip-flop.

4. A synchronous semiconductor memory device according to claim 3, wherein said chip select signal input circuit further comprises:
    a timing circuit, for detecting activation of said external chip select signal,
    wherein said delay circuit is a second flip-flop for changing to a first state in response to said first state of said first flip-flop and for changing to a second state in response to said detection of said activation of said external chip select signal.

5. A synchronous semiconductor memory device according to claim 4, wherein said timing circuit comprises:
    a first logic gate, for passing said external chip select signal therethrough when said enable signal is active;
    a second logic gate, for detecting activation of said external chip select signal by passing through said external chip select signal therethrough when said enable signal is inactive;
    a transfer gate, connected between an output of said first logic gate and a data input of said first flip-flop, on/off controlled by an output of said second logic gate; and
    a switching element, connected between said data input of said first flip-flop and a power supply potential, off/on controlled in association with said respective on/off control of said transfer gate.

6. A synchronous semiconductor memory device according to claim 4, further comprising:
    a third flip-flop, having inputs, said inputs thereof being connected to inputs of said second flip-flop in parallel, for outputting a second enable signal, having a circuit to force said second enable signal to be active while a burst signal is active;
    a second clock input circuit, for outputting a second internal clock depending on said external clock while said second enable signal is active; and
    a data input circuit, for inputting data in synchronization with said second internal clock while said second enable signal is active.

7. A synchronous semiconductor memory device according to claim 2, wherein said chip select signal input circuit comprises:
    a first flip-flop, for latching said external chip select signal in synchronization with said external clock and outputting its state as said internal chip select signal; and
    a delay circuit, for generating said enable signal by delaying an output of said first flip-flop.

8. A synchronous semiconductor memory device according to claim 7, wherein said first flip-flop comprises:
    a dynamic flip-flop, having a first data input, a second data input, a clock input, a first node, and a second node, said first and second nodes being precharged when said clock input is in a first logic state, said first and second nodes being in a floating state or discharged depending on logic states of said first and second data inputs, respectively, when said clock input is in a second logic state; and
    a latch circuit, for changing its state depending on either said first or second node being discharged, for holding its state while said first and second nodes are precharged.

9. A synchronous semiconductor memory device according to claim 8, wherein said chip select signal input circuit further comprises a timing circuit including:
    a transfer gate, connected between an input of said external chip select signal and said first data input, on/off controlled by outputs of said first flip-flop such that said transfer gate is on when said external chip select signal is active; and
    a switching element, connected between said first data input and a power supply potential, said power supply potential being such that said first node is in said floating state when said power supply potential is provided to said first data input, off/on controlled in association with said respective on/off control of said transfer gate.

10. A synchronous semiconductor memory device according to claim 9, wherein said timing circuit further comprises:
    a synchronization circuit, for inverting a logic state of said second data input after said external clock becoming said first logic state if said external clock is in said second logic state and said external chip select signal is active.

11. A synchronous semiconductor memory device according to claim 7, wherein said delay circuit is a second flip-flop which changes its state in response to a state change of said first flip-flop.

12. A synchronous semiconductor memory device according to claim 11, further comprising:
    a third flip-flop, having inputs, said inputs thereof being connected to inputs of said second flip-flop in parallel, for outputting a second enable signal, having a circuit to force said second enable signal to be active while a burst signal is active;

a second clock input circuit, for outputting a second internal clock depending on said external clock while said second enable signal is active; and a data input circuit, for inputting data in synchronization with said second internal clock while said second enable signal is active.

13. A synchronous semiconductor memory device according to claim 2, further comprising:

an automatic refresh circuit, having a refresh timer, for performing automatic refresh operation in response to a cyclic time-up signal from said refresh timer.

14. A synchronous semiconductor memory device operating in response to a clock signal, comprising:

a chip select signal input circuit receiving a chip select signal in response to said clock signal in a first clock cycle to output an enable signal; and a command input circuit receiving a command signal, the command input circuit being activated in response to said enable signal to receive said command signal in a next clock cycle of said first clock cycle.

* * * * *